US009880217B1

(12) United States Patent
Volkening et al.

(10) Patent No.: US 9,880,217 B1
(45) Date of Patent: Jan. 30, 2018

(54) MEASURING LINE CHARACTERISTICS OF THREE-PHASE POWER TRANSMISSION LINES

(71) Applicant: Exelis Inc., McLean, VA (US)

(72) Inventors: Fred A. Volkening, Boonsboro, MD (US); Meghan E. Hartnett, Laurel, MD (US)

(73) Assignee: Harris Corporation, Melbourne, FL (US)

( * ) Notice: Subject to any disclaimer, the term of this patent is extended or adjusted under 35 U.S.C. 154(b) by 553 days.

(21) Appl. No.: 14/199,372

(22) Filed: Mar. 6, 2014

(51) Int. Cl.
*G01R 31/08* (2006.01)

(52) U.S. Cl.
CPC .................................. *G01R 31/08* (2013.01)

(58) Field of Classification Search
CPC ...................................................... G01R 31/08
USPC .......................................................... 702/57
See application file for complete search history.

(56) References Cited

U.S. PATENT DOCUMENTS

| | | | | |
|---|---|---|---|---|
| 4,644,662 A * | 2/1987 | Anderson | ................ | G01C 9/20 33/366.19 |
| 4,714,893 A | 12/1987 | Smith-Vaniz | | |
| 4,794,328 A * | 12/1988 | Fernandes | ............... | G01K 1/024 29/240 |
| 2005/0286190 A1* | 12/2005 | Rostron | ............... | G01R 15/142 361/65 |
| 2007/0086130 A1* | 4/2007 | Sorensen | ............... | G01R 15/16 361/62 |
| 2008/0077336 A1* | 3/2008 | Fernandes | ........... | G01R 15/142 702/57 |
| 2008/0246507 A1* | 10/2008 | Gunn | ....................... | G01R 1/22 324/764.01 |
| 2012/0215469 A1* | 8/2012 | Serra | .................. | G01R 27/2694 702/61 |
| 2013/0054183 A1* | 2/2013 | Afzal | ................... | G01R 15/142 702/141 |
| 2016/0116517 A1* | 4/2016 | Duvillaret | ........... | G01R 15/165 324/457 |

OTHER PUBLICATIONS

Yi Yang et al., "A Survey on Technologies for Implementing Sensor Networks for Power Delivery Systems," Power Engineering Society General Meeting, 2007. IEEE , vol., No., pp. 1-8, Jun. 24-28, 2007, Tampa, Florida.

Larry Fish, "Power Donut™ Systems for Overhead Electric Power Line Monitoring," USI, Jan. 2012.

(Continued)

*Primary Examiner* — Michael Nghiem
*Assistant Examiner* — Peter Ngo
(74) *Attorney, Agent, or Firm* — Edell, Shapiro & Finnan LLC

(57) ABSTRACT

A line sensor assembly is described for measuring line characteristics in a power line such as voltage, phase, current, etc. The line sensor assembly includes a set of electric field sensors, where the electric field sensors are positioned annularly about an axis of the assembly corresponding to an axis of a power line. A measurement circuit is configured to measure an electric field across each of the electric field sensors to produce a set of electric field measurements. The set of electric field measurements may be used to determine the line characteristics of a given power line.

20 Claims, 8 Drawing Sheets

(56) References Cited

OTHER PUBLICATIONS

Sanna Uski-Joutsenvuo et al., "Maximising Power Line Transmission Capability by Employing Dynamic Line Ratings—Technical Survey and Applicability in Finland," VTT Technical Research Centre of Finland, Research Report Feb. 28, 2013.

\* cited by examiner

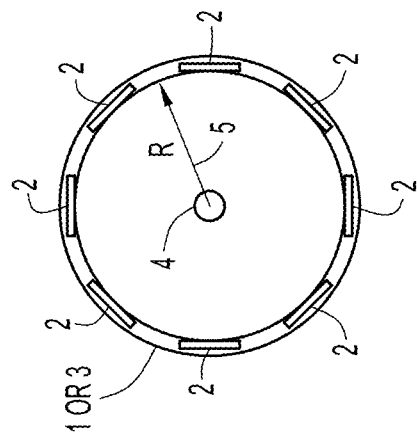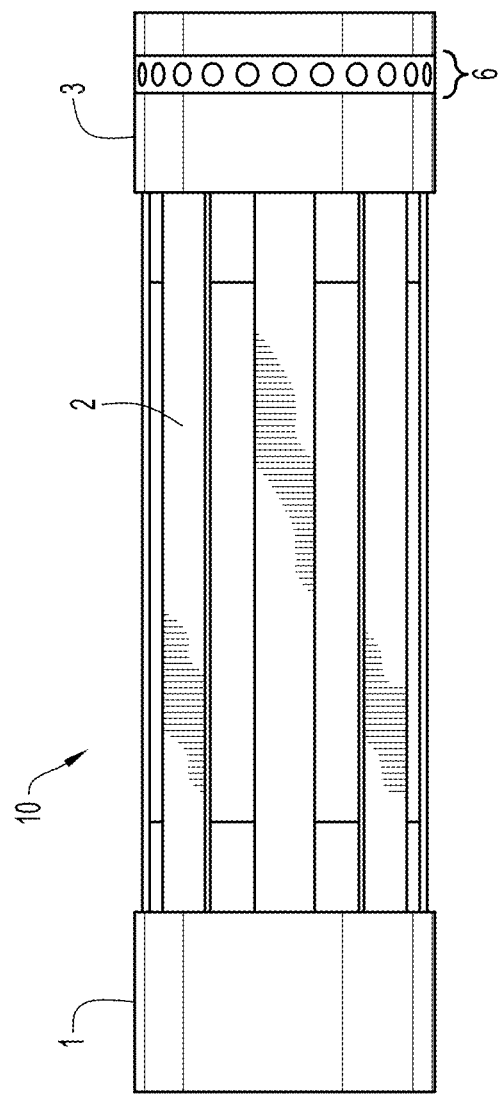

MEASURING LINE CHARACTERISTICS OF THREE-PHASE POWER TRANSMISSION LINES

BACKGROUND

Techniques for measuring characteristics of electric power lines such as voltage, current and environmental parameters are important for many reasons, including inter-grid and intra-grid power metering, gird monitoring and management, and providing power grid isolation and security. For example, a power glitch in one grid may induce a power "blackout" in another coupled grid. Power grids that are coupled or shared by one or more power providers are commonly used to distribute power and production costs across the one or more power grids, thereby reducing overall power costs to the power providers and end users.

In recent years, a number of initiatives have been started, e.g., "smart grid" initiatives, to allow robust grid management automation and to improve power grid efficiency and reliability for the sustainability of production and distribution of electricity. One of the challenges associated with a smart grid is the development of sensors and sensor networks. Electric utility operators have begun to deploy phasor measurement units (PMUs), PMU central controllers and Power Donuts® to monitor their grids. One of the most challenging areas for sensors is the development of individual power line sensors that can accurately provide the line characteristics, e.g., voltage, current and phase measurements, for single or multi-phase power transmission lines.

SUMMARY

Described herein are techniques for increasing the accuracy of line characteristic measurements, such as line voltage, current, etc. The techniques employ a plurality of electric field (E-field) measurement sensors placed annularly about a given power line (e.g., in a ring around and displaced from the power line) to measure electric fields in free space and associated variations thereof.

These techniques differ from existing line sensors, such as the Power Donut, that measure the charging current on a plate connected to the wire caused by a time varying electrical fields between the plate and the neighboring power wires and ground. This current flows through the circuit formed by a generator at the source end and between the wire and ground shunt capacitance. The Power Donut modifies the shunt capacitor so that the plate is connected directly to the sensed wire with the shut capacitance to ground occurring from the plate. The measurement of current is made using a trans-impedance amplifier configured as an integrator. Thus, in the Power Donut, there is a single plate sensor that surrounds the line to be sensed, thereby reducing or eliminating far-field electric field effects on the sensor plate.

Since the Power Donut does not measure electric fields in free space, the Power Donut is not able to measure fields external to the Power Donut with any sensitivity, i.e., the effects of the other wires in a three-phase system are not measurable. In other words, since the electric field cannot be accurately measured for all three lines based on the Power Donut shunt current measurement, the Power Donut cannot be used to calculate the line to neutral potentials for the three lines when acting as a stand-alone unit.

In contrast, the plural E-field sensors of the present invention use a displacement current sensor (or other E-field sensor) to measure the electric field at multiple locations around a given wire or power line. Since the present invention embodiments measure the electric field in free space (e.g., as opposed to a displacement current in the shunt capacitance to ground), the plural electric field measurement sensors or units can sense not only a given wire's E-field, but other source and sink E-fields that originate from other wires in a multiphase system, neutral wires, ground wires, the Earth plane, or other near-field anomalies that occur due to externalities such a line sag or trees that grow to encroach upon a given power line.

In sum, the techniques described herein provide for a computer program product, method, system and apparatus for measuring electric field potential in a power line comprising a plurality of electric field measurement units, where the electric field measurement units are positioned annularly about an axis corresponding to an axis of a power line (e.g., arranged in a ring spaced apart from and around the axis). A circuit is configured to measure an electric field across each of the plurality of electric field measurement units to produce a set of free-space electric field measurements, and a transmitter is configured to supply the set of electric field measurements to a processor configured to compute line characteristics for the power line (e.g., the processor can be remotely located at a base station). The line characteristics may include, among other items, line sag, voltage, current, and line to neutral voltage with corresponding amplitude, phase and angular frequency components.

The above and still further features and advantages of the present invention will become apparent upon consideration of the following definitions, descriptions and descriptive figures of specific embodiments thereof wherein like reference numerals in the various figures are utilized to designate like components. While these descriptions go into specific details of the invention, it should be understood that variations may and do exist and would be apparent to those skilled in the art based on the descriptions herein.

BRIEF DESCRIPTION OF THE DRAWINGS

FIG. 1A is a longitudinal side view in elevation of a line sensor assembly comprising a plurality of E-field sensors in accordance with an example implementation of the inventive concepts described herein.

FIG. 1B is an end (axial) view of the line sensor depicted in FIG. 1A showing an orientation of the plurality of E-field sensors relative to a central axis in accordance with an example implementation of the inventive concepts described herein.

DETAILED DESCRIPTION

Figure 1C:
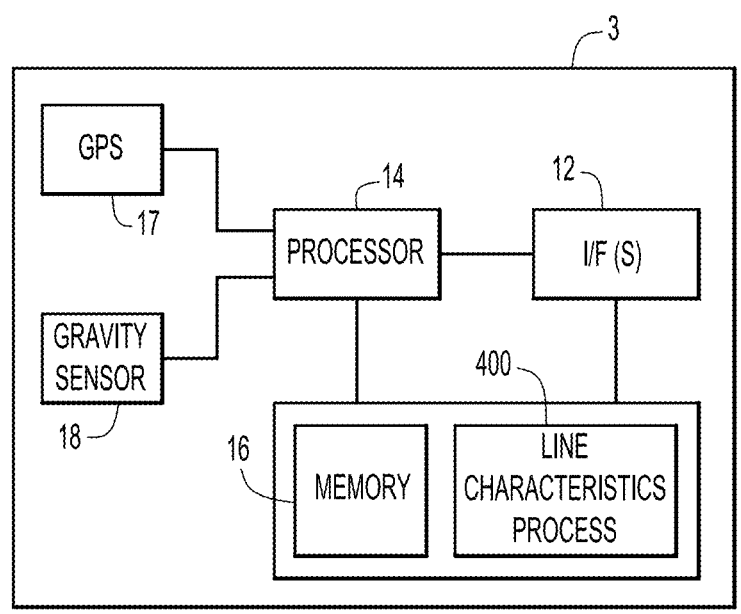
FIG. 1C is a block diagram illustrating an example electronic support package for the line sensor depicted in FIG. 1A in accordance with an example implementation of the inventive concepts described herein.

Described herein is a new technique and associated variations for accurately and efficiently determining line characteristics of three-phase power distribution systems.

Referring to FIG. 1A, a line characteristic measurement device or line sensor assembly 10 comprising a plurality of E-field sensors 2 is shown. The line sensor assembly 10 has structural support end portions 1 and 3. The plurality of E-field sensors 2 are placed annularly about a central longitudinal axis that, when deployed on a power line whose characteristics are to be measured, is coincident with the power line such that the E-field sensor surface is substantially parallel to the power line. As used herein and in the claims, the terms "annular" and "annularly" refer to a configuration in which the sensors are positioned in a substantially ring-like arrangement around the central axis of the line sensor assembly 10 such that the E-field sensors 2 are spaced apart or displaced from the central axis to provide significant spatial diversity in the context of measuring the electric field at the different E-field sensors 2 around a power line. While the term "annularly" includes arrangements in which the E-field sensors 2 are equidistant from the central axis as shown in FIG. 1B, it also encompasses other arrangements in which the distances of the E-field sensors 2 from the central axis vary, e.g., an oval, elliptical, square, or other shaped ring arrangements. The E-field sensors 2 may be any one of a number of E-field sensors available commercially; however, one example E-field measurement device is described herein in connection with FIG. 2.

In one example configuration, line sensor 10 may be configured to employ an external configuration sensor or array 6. The configuration array 6 may employ active or passive sensor elements to enable a system auto-configuration process that is described hereinafter.

Turning to FIG. 1B, the line sensor assembly 10 is shown in an end-on arrangement as viewed down the central axis of assembly 10 (which coincides with the position of the power line to be sensed). Structural support for the eight E-field sensors 2 is provided by structural support end portions 1 and 3. Each end portion 1, 3 is generally cylindrical, having an outer rim to which is secured one end of each of the E-field sensors 2, which extend longitudinally between the end portions in parallel with the central axis. According to one example, each end portion 1, 3 includes a disk-shaped member 4 extending inward from the outer rim 1, 3 to a center aperture configured to engage or clamp onto a power line. In the example shown in FIG. 1B, eight E-field sensors 2 are placed annularly about the central axis at regular 45 degree angles and at the same radial distance from the central axis. It should be noted that any number of plural E-field sensors 2 may be used in line sensor assembly 10 and arranged in any manner about the central axis, e.g., the E-field sensors 2 do not need to be equally spaced from each other, and need not be equidistant from the central axis, but should be spaced apart from a given power line and each other to provide spatial diversity when measuring E-fields. The support end portions 1 and 3 provide structural support for E-field sensors 2 since the E-field sensors 2 would otherwise reside in free space or air, i.e., air or some other gas, for which structural supports 1 and 3 hold the E-field sensors 2 in a fixed position. Other structural components or housing components may be provide, e.g., for environmental protection.

The support structure shown in FIG. 1B is just one example. In general, the support structure can have any configuration that engages a power line along a central axis of the assembly and that secures the electric field sensors in stable positions arranged annularly around and spaced apart from the central axis and spaced apart from each other to provide spatial diversity for sensing electric fields.

When modeled using finite element modeling (FEM) or other analysis, an even number of E-field sensors 2 numbering four or more, equally spaced radially, equidistant from the central axis or that have equivalent E-field sensing surface areas, may provide a number of mathematical simplifications such that a number of modeling terms naturally fall out of the analysis equations due to design symmetries.

Either of the support ends 1 or 3 may house an electronics package that is further described in connection with FIG. 1C. FIG. 1C depicts support end 3 with an electronics package to support the techniques described herein. Generally, the electronics package 3 comprises one or more input/output (I/O) interfaces 12, a processor 14 and a memory/storage unit 16. Processor 14 can be, for example, a microprocessor, a microcontroller, a digital signal processor (DSP), etc. I/O interface(s) 12 can be one or more devices, e.g., Ethernet card or module, fiber or wireless unit that is configured to enable communications over a network according to any of a variety of networking protocols and to interface to auto-configuration array 6. Memory/storage unit 16 can be any tangible processor-readable or computer-readable memory or device that stores or is encoded with instructions that, when executed by processor 14 cause the processor to perform the functions described herein. For example, memory/storage unit 16 is encoded with logic for computing line characteristics data in a suitable format according to a line characteristic measurement process 400 that is described in connection with FIG. 4.

The electronics package 3 may further comprise other sensors to facilitate the techniques describe herein. For example, electronics package 3 may comprise a Global Positioning System (GPS) device 17 or other location system that can provide sensor location, e.g., latitude, longitude, altitude, etc., as well as to provide timing variables that may be used for synchronization. Electronics package 3 may also comprise a gravity sensor 18 that provides an orientation to an Earth plane (FIG. 3B) relative to the plurality of E-field sensors 2. Although not shown, the electronics package 3 may include an environmental sensor to measure environmental parameters such as temperature, humidity, etc.

While FIG. 1C shows a processing environment comprising data processor 14 that execute software stored in memory/storage device 16, an alternative processing environment is a fixed data processing element, such as an application specific integrated circuit (ASIC) that is configured, through fixed hardware logic, to perform logic functions. Yet another possible data processing environment is one involving one or more field programmable logic devices, or a combination of fixed processing elements and programmable logic devices. In one form, logic may be embodied in a tangible processor-readable medium that is encoded with instructions for execution by a processor that, when executed by the processor, operate to cause the processor to perform the functions described herein.

Figure 2:
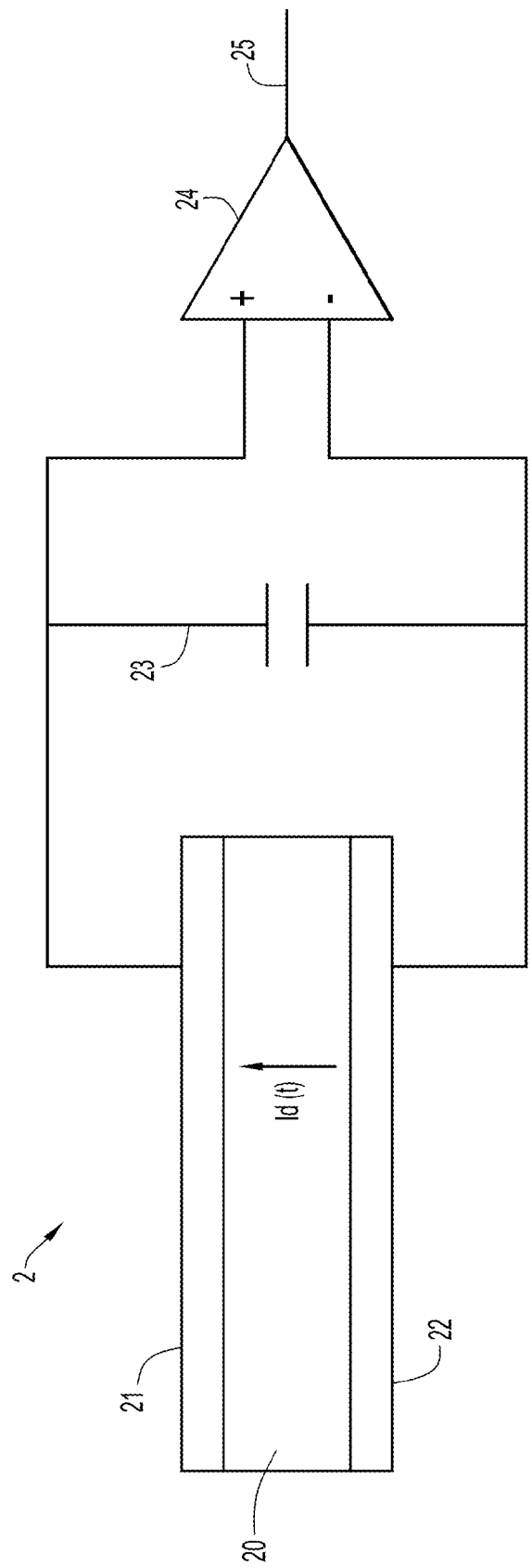
FIG. 2 is a diagram of one example of an E-field sensor comprising a capacitive plate with coupled sensing electronics in accordance with the inventive concepts described herein.

Referring to FIG. 2, an example of an E-field sensor 2 comprising a capacitive plate with coupled sensing electronics is now described. E-field sensor 2 includes a first conductive plate 21, a second conductive plate 22, and a dielectric material 20 disposed there between. The conductive plates 21 and 22 are electrically coupled to an integrating capacitor 23 and amplifier 24 as viewed in FIG. 2. The output 25 of amplifier 24 is coupled to electronics package 3 for further processing. For example, the electronics package 3 may include an analog-to-digital (A/D) converter for sampling the outputs 25 from the plurality of E-field sensors 2. It should be understood that the surface areas and geometries of plates 21 and 23, and dielectric material 20 may be designed for a given line characteristics measurement application. The capacitance of integrating capacitor 23 may be sized accordingly.

Figure 3A:
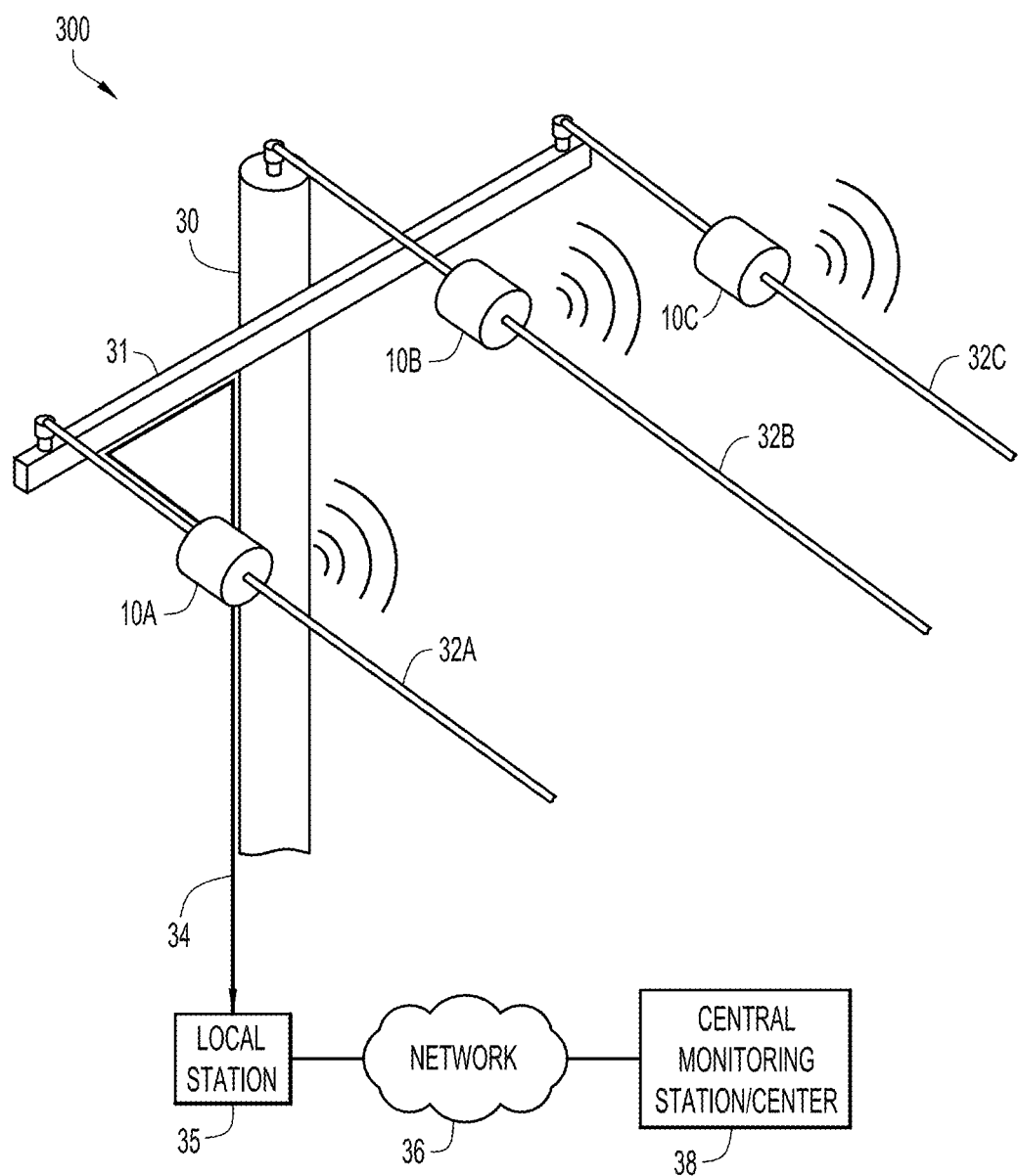
FIG. 3A is a high-level three-dimensional spatial diagram of a pylon supporting three power lines in a three-phase power transmission system with corresponding line sensors in accordance with an example implementation of the inventive concepts described herein.

FIG. 3A depicts a high-level three-dimensional spatial diagram of a system 300 that includes a power transmission pylon 30 supporting three power lines in a three-phase power transmission system, where each power line has a corresponding line sensor assembly 10. More specifically, pylon 30 includes a power line supporting crossbar 31 to support power lines 32A, 32B, and 32C corresponding to three phases A, B and C in a three-phase power distribution system. Each power line 32A, 32B and 32C has a respective line sensor assembly 10A, 10B, and 10C coupled thereto. System 300 may include a local station 35, a network 36 and a central monitoring station or center 38.

In this example, each line sensor assembly 10 may include an I/O interface 12 (FIG. 1C) that has a wireless or radio frequency (RF) transmitter or transceiver to transmit data collected by each line sensor assembly 10. The RF transmitter may include a short range transmitter, e.g., Bluetooth®, or longer range transmitter for transmitting according to, e.g., cellular protocols.

The line sensor assemblies 10A-10C may wirelessly transmit to each other, to local station 35 or to monitoring center 38. In this regard, the line sensor assemblies 10A, 10B and 10C respectively associated with power lines 32A, 32B and 32C may each be in a master/slave configuration. For example, line sensor assemblies 10C and 10B may be slaves that transmit to line sensor assembly 10A acting as a master (e.g., using Bluetooth), whereby master line sensor assembly 10A transmits the data collected for all line sensor assemblies 10 to a data collection point (e.g., using cellular protocols). In another example, it may not be desirable to use RF for the I/O interfaces 12 and a hard connection 34 (e.g., fiber optic, coaxial, twisted pair, etc.) may be employed to reduce interference or to increase data security.

Given the architecture of the various components described herein, it should be understood that the data collection and processing components may be distributed within system 300. For example, all data collection and processing may be performed by a line sensor assembly 10, or the line sensor assembly 10 may be a "dumb" terminal that transmits only E-field measurements which are processed elsewhere, e.g., by local station 35 or central monitoring station 38. Data analysis, decimation and storage are further described below.

The line sensor assembly 10 can be used as a single or stand-alone unit in a single or multiphase power system, or as a system of line sensor assemblies 10 that work collectively to increase the accuracy of measured line characteristics, e.g., voltage, current, etc., for lines 32. For example, a single line sensor assembly 10A can measure the line to neutral/ground voltages of all three power lines 32A, 32B and 32C without additional line sensor assemblies. However, if line sensor assemblies 10B and/or 10C are added to the measurement system, then the accuracy of the line measurements are improved due both the increase in number of measurements and to their spatial diversity.

Figure 3B:
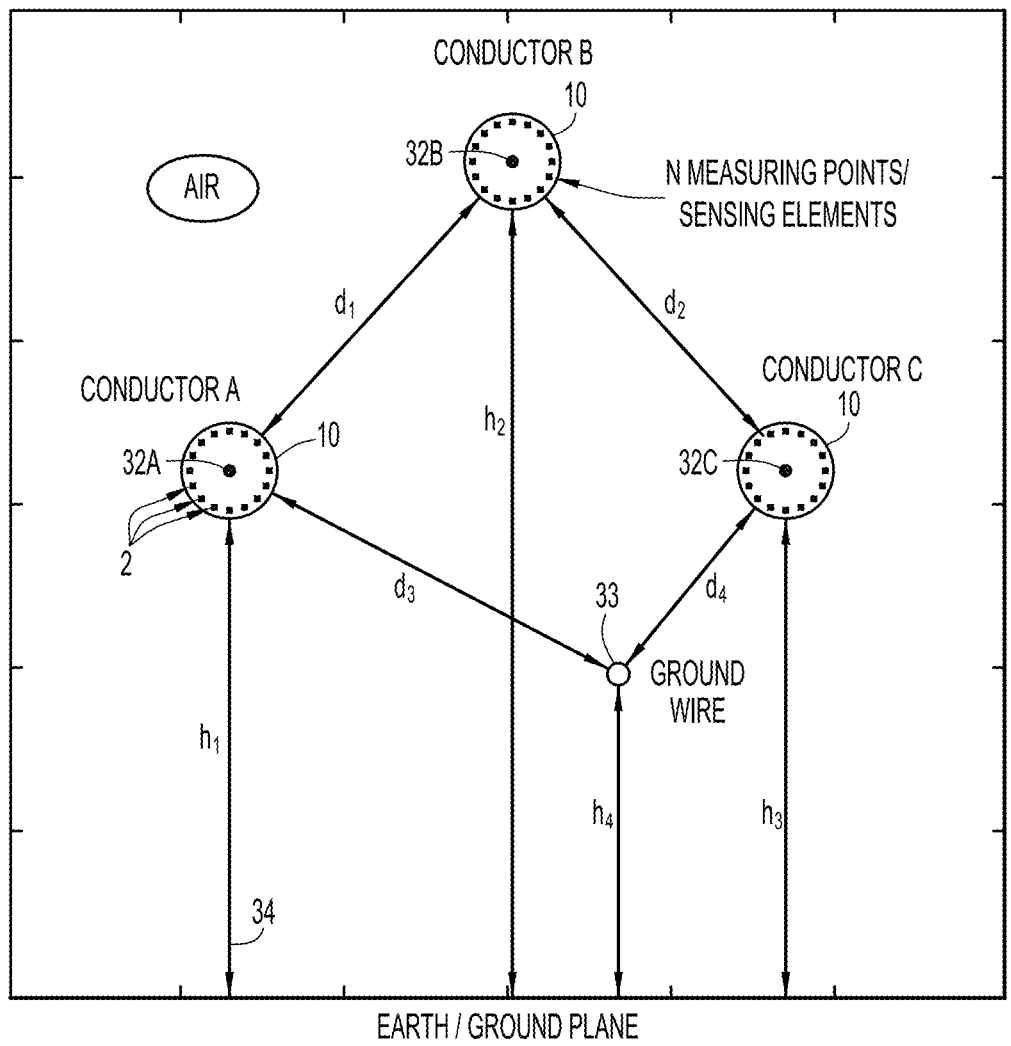
FIG. 3B is a lower-level two-dimensional spatial diagram illustrating the relative positions of the one or more line sensors from FIG. 2A as viewed into the power line axes in accordance with an example implementation of the inventive concepts described herein.

Turning to FIG. 3B, power lines 32A, 32B, and 32C and corresponding line sensor assemblies 10A, 10B or 10C are shown transverse to the power line axes. For continuity of illustration, each line sensor assembly 10 is shown with a plurality of annularly disposed dots that depict a plurality N of E-field sensors 2 positioned about each power line 32. Also shown in FIG. 3B are a ground wire 33 and an Earth plane 34 that represents the surface of the Earth. It should be noted that some three-phase power transmission systems employ a neutral wire which may or may not be grounded. The geometric relationships shown in FIG. 3B are not to scale, but can be used to mathematically model the E-fields present in a given power transmission system when the dimensions are defined. Accordingly, the techniques described herein for determining the line voltages provides improved accuracy and for determining when any field perturbing objects are in the vicinity of the system, e.g., encroaching trees.

As mentioned above, the techniques described herein may employ finite element modeling (FEM) as an initialization step for the determination of a geometrically dependent system matrix and the effects of the E-field sensors and sensor housing. The modeling of a three-phase line conductor system provides an ability to determine geometrically dependent variables of the system, such as capacitance between the lines/conductors and ground, as well as from conductor to conductor. Since FEM may be used as an initialization part of the setup, the line sensor assemblies 10 can be designed for any geometry of three-phase conductors, and take advantage of the linearity of the system and the basic electrostatic principles that define the system.

Key parameters are input to the FEM software such as, e.g., height of the conductors h1, h2, h3 and h4 from the ground plane 34, distances d1, d2, d3, and d4 between conductors, and the presence of a ground wire 33 as viewed in FIG. 3B. Based on the key parameters, a matrix is formed that is unique to the geometry of system 300 and provides information that may be used to extract the line to neutral voltages from plural E-field measurements. When three line sensor assemblies 10 are used, sensor data from all three line sensor assemblies 10 (i.e., from the plurality of E-field sensors 2 of each line sensor assembly 10) can be used to derive a more accurate voltage than when a single line sensor assembly 10 is used (e.g., when processed by line characteristic measurement process 400).

Individual sensor data may also be used for a self-check routine and for determining when new electric field perturbing objects have entered or been removed from the system such as trees or vehicles.

From the geometries entered into the FEM, a predicted E-field measurement column matrix is derived for each line sensor assembly 10 with N associated E-field sensors 2. The geometric parameter matrices are based on the geometries entered into the FEM and any resulting capacitances that are inherent to the systems based on those geometries. The matrices may be referred to herein as geometric parameter matrices. For example, to develop geometric parameter matrices for line sensor assemblies 10A, 10B and 10C with respect to line 32A, the FEM may apply, e.g., 1 volt (V) to line A and 0 V to lines B and C. The FEM simulation is executed to determine electric field at each of the N E-field sensors 2 surrounding all three conductors to determine the predicted E-field column vectors for line sensor assemblies 10A, 10B and 10C, respectively, and denoted by:

$$A1 = [N \times 1] \; B1 = [N \times 1] \; C1 = [N \times 1]$$

where A1 is the E-field matrix predicted by FEM for line sensor assembly 10A with respect to line 32A, B1 is the E-field matrix predicted by FEM for line sensor assembly 10B with respect to line 32A and C1 is the E-field matrix predicted by FEM for line sensor assembly 10C with respect to line 32A.

Similarly, to derive predicted geometric parameter matrices with respect to line 32B, 1 V is applied to line 32B and 0 V to lines 32A and 32C. The FEM is executed to determine electric field at each of the N E-field sensors 2 surrounding all three conductors to determine the predicted E-field column vectors for line sensor assemblies 10A, 10B and 10C with respect to line 32B, and denoted by:

$$A2 = [N \times 1] \; B2 = [N \times 1] \; C2 = [N \times 1]$$

where A2 is the E-field matrix predicted by FEM for line sensor assembly 10A with respect to line 32B, B2 is the E-field matrix predicted by FEM for line sensor assembly 10B with respect to line 32B and C2 is the E-field matrix predicted by FEM for line sensor assembly 10C with respect to line 32B.

Again, to derive predicted geometric parameter matrices with respect to line 32C, 1 V is applied to line 32C and 0 V to lines 32A and 32B. The FEM is executed to determine electric field at each of the N E-field sensors 2 surrounding all three conductors to determine the predicted E-field column vectors for line sensor assemblies 10A, 10B and 10C with respect to line 32C, and denoted by:

$$A3 = [N \times 1] \; B3 = [N \times 1] \; C3 = [N \times 1]$$

where A3 is the E-field matrix predicted by FEM for line sensor assembly 10A with respect to line 32C, B1 is the E-field matrix predicted by FEM for line sensor assembly 10B with respect to line 32C and C1 is the E-field matrix predicted by FEM for line sensor assembly 10C with respect to line 32C.

The FEM simulation predicted geometric parameter matrices for each line sensor assembly are combined as shown below. For example, with respect to line sensor assembly 10A, matrices A1, A2 and A3 are combined into an N×3 matrix A. The N×3 matrices for each line sensor assembly 10A, 10B, and 10C are depicted below:

$$A = [A1 \; A2 \; A3]$$

$$B = [B1 \; B2 \; B3]$$

$$C = [C1 \; C2 \; C3]$$

The use of the A, B and C N×3 matrices is further explained hereinafter.

Figure 3C:
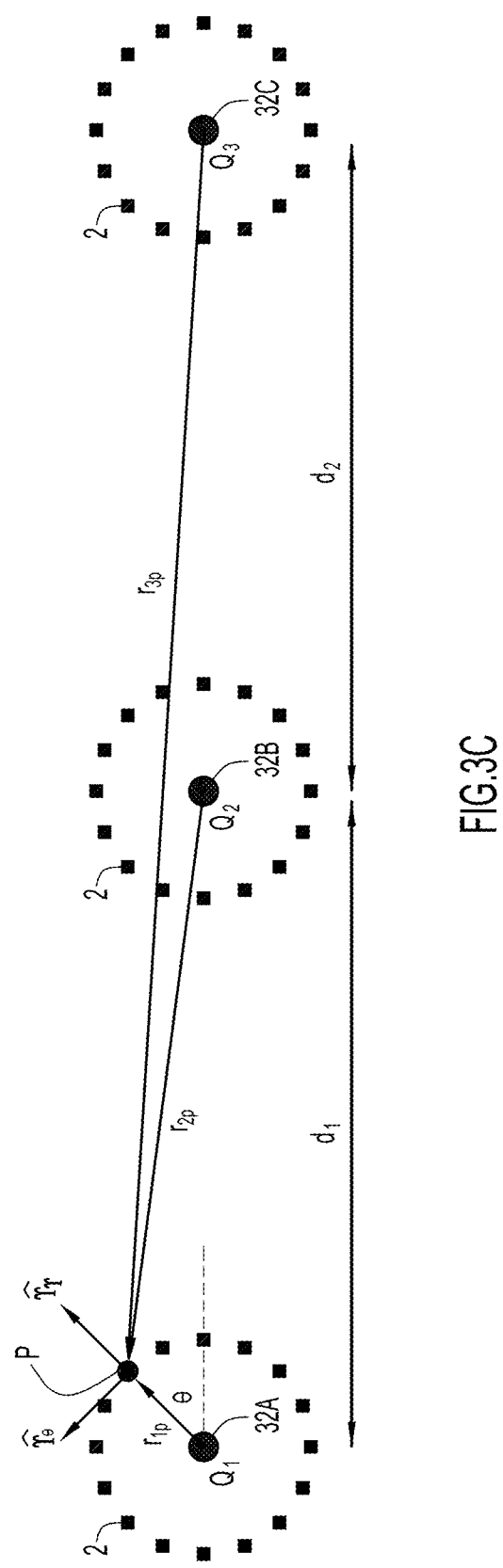
FIG. 3C is a diagram that illustrates the composite effects of electric fields generated by second and third power lines upon E-field sensors in a line sensor coupled to a first power line when deployed in a three-phase power system according to an example implementation of the inventive concepts described herein.

Referring to FIG. 3C, a subset of the components from FIG. 3B is shown that illustrates the effects of electric fields generated by second and third power lines upon E-field sensors in a line sensor assembly, e.g., line sensor assembly 10A, coupled to the first power line 32A when deployed in a three-phase power system.

FIG. 3C depicts power lines 32A, 32B and 32C in a linear fashion for ease of description with distances d1 and d2 denoted there between. Each power line 32 is further denoted by their linear charge densities $Q_1$, $Q_2$, and $Q_3$, respectively, e.g., as capacitance (C) per meter (m) or Farads (F/m). To any given E-field sensor 2, e.g., denoted as a point (p) for one given point of measurement shown for line 32A, radii are depicted from each line 32 to p, and are denoted in FIG. 3C as $r_{1p}$, $r_{2p}$ and $r_{3p}$, respectively.

The electrostatic theory for techniques described herein is provided next. The electric field (E-field) of a long, straight conductor is shown in equation 1:

$$\vec{E} = \frac{Q}{2\pi\varepsilon_0 r}\vec{r} \qquad \text{(Eq. 1)}$$

where Q=charge per unit length (C/m), $\varepsilon$=permittivity of free space (8.85 $e^{-12}$ $C^2/Nm^2$), and r=distance in meters from the conductor. Rearranging the terms of Eq. 1 to define Q yields:

$$Q = CV$$

where C is the conductor capacitance in Farads per meter (F/m) and V is the electric potential of the conductor.

The electric field satisfies the superposition principle. If more than one conductor is present, the total electric field at any point (p) is equal to the vector sum of the separate electric fields that each conductor 32 would create in absence of the other electric fields. As viewed in FIG. 3C, the E-field measured at a given point p has angular E-field component $\hat{r}_\theta$ defined in terms of an angle $\theta$ about $Q_1$ and a radial component $\hat{r}_r$.

$$\vec{E} = \sum_{i=1}^{M} \vec{E_i}$$

or as defined in terms of Q with respect to point p and vectors r:

$$\vec{E_p} = \frac{1}{2\pi\varepsilon_0} \sum_{i=1}^{M} \frac{Q_i}{r_{ip}} \hat{r}_{ip} \qquad \text{(Eq. 2)}$$

where $\hat{r}_{ip}$= =unit vector from the axis of conductor i to point p. As seen from equation 2 above, the electric field at a point surrounding a conductor is a function of the distances ($r_{ip}$) from each conductor in the system and the charges ($Q_i$) from each conductor. Each of these values is geometrically dependent on the position of the conductors in space as well as the position of the electric field measuring point in space, for example, as described with respect to FIG. 3B.

The present invention embodiments implement multiple electric field measurements. The electric field for multiple points can be expressed in generalized matrix form due to the linearity of the system, as shown below:

$$[\vec{E}] = k \, [\vec{G}][Q]$$

For a multi-conductor system, the matrix of conductor charges [Q] may be expressed by [Q]=[C][V]. For a system of M conductors, the capacitance matrix [C] is an M×M matrix. The capacitance matrix [C] is dependent on the geometry of the conductors and their distance from the ground plane.

$$[\vec{E}] = k\,[\vec{G}][C][V] \text{ where } [\vec{G}] = [Gr]\hat{r} + [G\theta]\hat{\theta}$$

where:
[E]=matrix of electric field values
k=constant value due to permittivity of the surrounding space
[G]=matrix of geometric values at specific electric field measuring points
[C]=capacitance matrix
[V]=electric potential matrix The preferred embodiment measures the electric field at points annularly spaced about the conductor. This configuration was chosen because of the radial direction of the electric field close to the conductor and for simplicity of design for a sensor that is configured to clamp on to a power line, e.g., by an installation technician. Due to the geometric dependence of the electric field measurement elements (e.g., E-field sensors 2) relative to the conductors (e.g., lines 32), any sensor array may be utilized.

Suppose there are N electric field measurement elements (e.g., E-field sensors 2) within a line sensor assembly (e.g., line sensor assembly 10) surrounding a conductor of a three-phase system. The system may be modeled as described above and electric field values may be determined using the lumped parameters method. A column of the matrix is determined for each case for Conductor A:

$$\begin{bmatrix}\vec{E_1}\\\vdots\\\vec{E_N}\end{bmatrix} = \begin{bmatrix}\vec{A_{11}} & 0 & 0\\\vdots & 0 & 0\\\vec{A_{1N}} & 0 & 0\end{bmatrix}\begin{bmatrix}1\\0\\0\end{bmatrix} \rightarrow \begin{bmatrix}\vec{E_1}\\\vdots\\\vec{E_N}\end{bmatrix} = \begin{bmatrix}0 & \vec{A_{21}} & 0\\0 & \vdots & 0\\0 & \vec{A_{2N}} & 0\end{bmatrix}\begin{bmatrix}0\\1\\0\end{bmatrix} \rightarrow$$

$$\begin{bmatrix}\vec{E_1}\\\vdots\\\vec{E_N}\end{bmatrix} = \begin{bmatrix}0 & 0 & \vec{A_{31}}\\0 & 0 & \vdots\\0 & 0 & \vec{A_{3N}}\end{bmatrix}\begin{bmatrix}0\\0\\1\end{bmatrix}$$

$$[\vec{A}] = \begin{bmatrix}\vec{A_{11}} & \vec{A_{21}} & \vec{A_{31}}\\\vdots & \vdots & \vdots\\\vec{A_{1N}} & \vec{A_{2N}} & \vec{A_{3N}}\end{bmatrix}$$

From the above electric field equation, it can be seen that, $$[\vec{A}] = k[\vec{G}][C]$$

Matrix [A] can be substituted into the electric field equation of the system. The same method is utilized for determining matrix B and matrix C for electric field measurements surrounding Conductor B and C, respectively. When rearranged, the matrices define E-field vectors for each line sensor, as shown below:

$$[\vec{E_A}] = [\vec{A}]\begin{bmatrix}VA\\VB\\VC\end{bmatrix} \quad [\vec{E_B}] = [\vec{B}]\begin{bmatrix}VA\\VB\\VC\end{bmatrix} \quad [\vec{E_C}] = [\vec{C}]\begin{bmatrix}VA\\VB\\VC\end{bmatrix}$$

The voltages $V_A$, $V_B$ and $V_C$ can be determined with any set of equations through the simple inversion of matrices A, B, and C and known electric field measurements at predetermined points.

Matrices A, B, and C may not be square matrices, with (N×3) elements; therefore, the Moore-Penrose pseudo-inverse technique may be utilized to perform the matrix inversion, as shown below:

$$\begin{bmatrix}VA\\VB\\VC\end{bmatrix} = (A^TA)^{-1}A^TE_A, \quad \begin{bmatrix}VA\\VB\\VC\end{bmatrix} = (B^TB)^{-1}A^TE_B, \quad \begin{bmatrix}VA\\VB\\VC\end{bmatrix} = (C^TC)^{-1}C^TE_C$$

If the line to neutral voltages calculated from each apparatus are within a certain percentage of agreement, then more accurate values are determined through the same method, but with the combination of all matrices and all three apparatus' measurement data, as shown below:

$$ABC = \begin{bmatrix}A\\B\\C\end{bmatrix}, E_{ABC} = [\,EA \quad EB \quad EC\,],$$

$$\begin{bmatrix}VA\\VB\\VC\end{bmatrix} = (ABC^TABC)^{-1}ABC^TE_{ABC}$$

By way of finite element simulations of different three-phase conductor systems, it was determined that the techniques described above are valid for any type of conductor geometry (e.g., horizontal, vertical, delta, etc.) with the inclusion of a ground wire. A minimum of 4 sensing elements (e.g., E-field sensors 2) within each line sensor (e.g., line sensor assembly 10) will give reasonable accuracy (e.g., less than 10% error) for individual sensor measurements of each conductor's line to neutral voltage within the system. However, when all of the electric field measurements are combined into one large matrix, the accuracy increases and very low error is obtained. Since the method of determining line to neutral voltages involves solving a set of linear equations through matrix inversion, the larger the matrix to be inverted, the better the result. The larger matrix provides more information on the location of the electric field measurement relative to the conductors in the system, therefore a better solution can be obtained from the larger system of equations.

Figure 4:
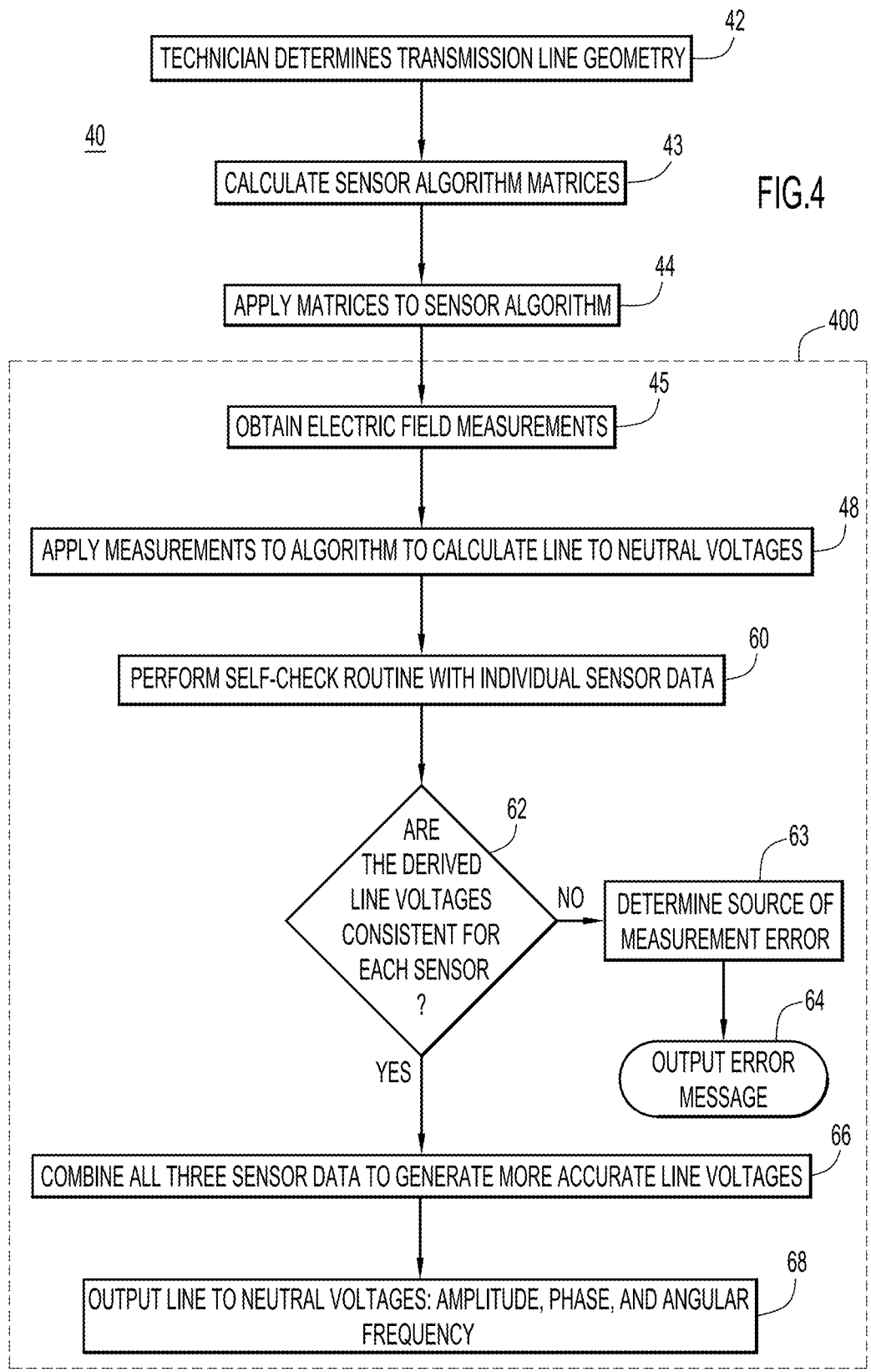
FIG. 4 is a flow diagram illustrating operations performed to generate line characteristics from one or more line characteristic measurement devices according to an example implementation of the inventive concepts described herein.

FIG. 4 is a high-level flowchart illustrating operations performed in two separate processing sequences. The first sequence provides provisioning functions to define the [A], [B], and [C] matrices based on the geometries of the system to be measured. The provisioning sequence may use human data entry or be executed by a line sensor assembly 10 using the techniques described herein with respect to auto-configuration. Once defined, the matrices can be used for the second "active" processing sequence to derive line characteristics (e.g., voltage, phases, etc.) in near real-time based on actual E-field measurements (e.g., using line characteristics measurement process 400 described above with respect to FIG. 1C). The sequence for line characteristics measurement process 400 is delineated the dashed rectangle surrounding the steps for the second active sequence and may be executed, e.g., by a processor such as processor 14 (FIG. 1C) or by a remote monitoring system (e.g., central monitoring station 38).

In one embodiment, at 42, a field technician measures the power line geometry for the system to be monitored. The geometric measurements include, e.g., height of conductors h1, h2, h3, and h4 from ground plane 34, distance d1, d2, d3, and d4 between conductors, and the presence of a ground wire 33 as described above in connection with FIG. 3B. From the system geometry, at 43, the matrices for the sensor algorithm are calculated (e.g., the [A], [B] and [C] matrices). At 44, the matrices are applied to the sensor algorithm. For example, the matrices may be stored in non-volatile memory (e.g., memory 16) or at the remote monitoring system.

Once provisioned, the line characteristics measurement process 400 becomes active. At 45, E-field measurements are obtained from each of the E-field sensors 2 in each of the line sensor assemblies 10 that are provisioned for a given system. At 48, the E-field measurements are applied within the line characteristics measurement process 400 in order to calculate, among other characteristics, the line to neutral voltages for lines configured for the measurement system.

At this point, at 60, a self-check routine may be performed based on either the E-field measurements or the computed line characteristics. By way of example, since the system geometries are known, all of the voltages or other line characteristics should fall within known ranges. Thus, regardless of the system voltage, the E-field measurements should conform to the system geometries. When the measurements do not conform or cross-check with each other, it may be inferred that a physical change in the system has occurred. Physical changes may be internal such as a contaminated sensor, component aging, capacitor failure, and sensor damage; or external such as line sag, vegetation encroachment, new construction, etc. According to one option, baseline measurements can be taken at a first time and can be used in the process of determining whether subsequent measurements deviate from expected values.

Accordingly, at 62, it is determined whether the line voltages are consistent for each sensor (i.e., as expected based on geometry and/or baseline values). If not, at 63, potential sources of measurement error are determined. For example, if a measurement from an individual E-field sensor 2 deviates by more than a predetermined amount from an expected value, then in may be inferred that that sensor has a problem, or when a series of localized E-field sensors indicate an anomaly, then it may be inferred that there has been physical encroachment by trees, trucks, new construction, etc. At 64, an error message may be sent, e.g., to the system operator, to indicate the anomaly and potential cause (if discernible).

At 66, if it is determined that the line voltages are consistent, then all available sensor data from the installed sensor base (e.g., 1, 2, 3 or more sensor assemblies 10) are combined to improve the accuracy of the voltage (and other characteristic) measurements. At 68, the line to neutral voltages are output.

When determining line characteristics, any given power line transmits alternating current (AC) as a continuous waveform. However, for monitoring purposes, E-fields may be measured or digitally sampled at discrete points in time. Thus, to complete the picture, the E-fields may be measured at a sampling rate or frequency that is greater than the frequency of the power transmission system. In typical power transmission systems, power is typically transmitted at 50 or 60 Hertz (Hz). As is generally known, to understand the characteristics of a wave form, the waveform has to be digitally sampled at a frequency greater than its highest frequency component, e.g., sampling at the Nyquist rate or other sampling rate based on any known characteristics of the signal to be sampled. In one example, power line phasor measurement systems typically take measurements at 2880 Hz.

Accordingly, large amounts of data may be generated when sampling E-field signals from a plurality of E-field sensors 2 in a plurality of line sensor assemblies 10. These data may be stored at a central analysis point or database. Once analyzed, the data may be further decimated to a lower sampling rate (e.g., once per second, minute, hour, etc.) to facilitate long term analysis and reduce the volume of stored data. Similar data preprocessing may be performed either by a line sensor assembly 10 or local station 35, and the resulting line characteristics are report to the central monitoring station 38 on a periodic basis, e.g., one per second, minute, etc. If harmonics or other characteristics are not to be considered, then the sampling rate may be lowered.

Figure 5:
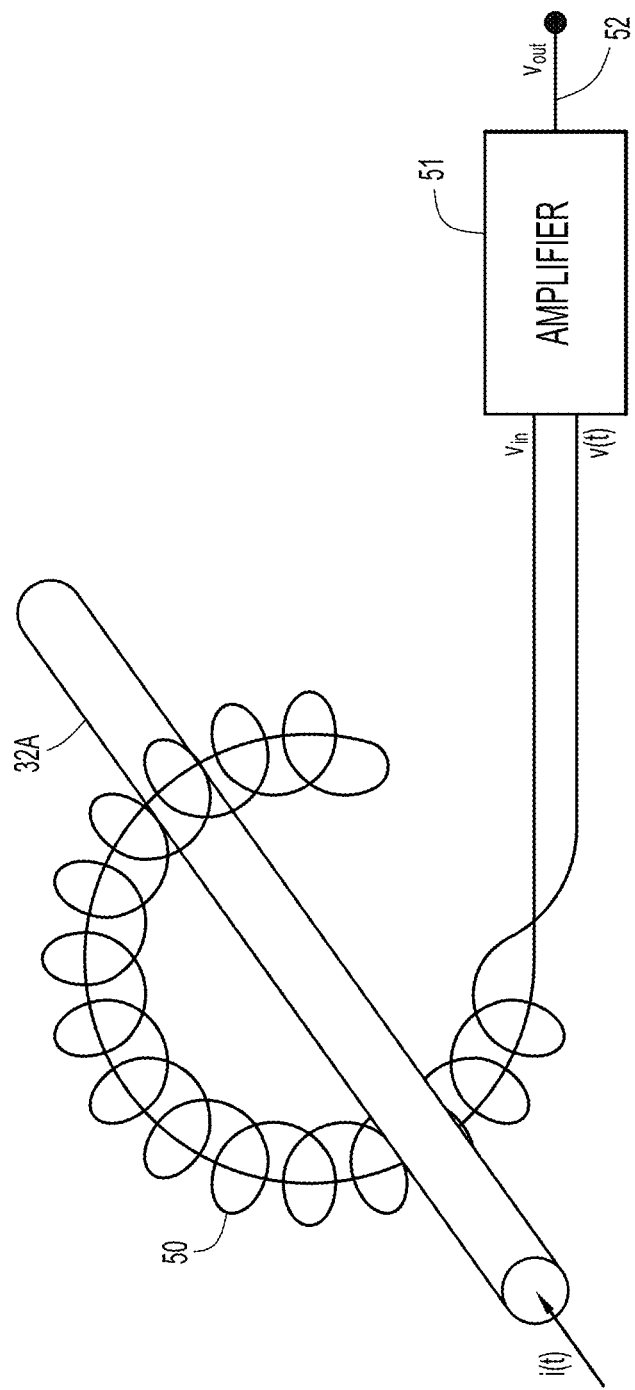
FIG. 5 is a block diagram of a Rogowski coil to measure current that may be included in the electronics package of the line characteristic measurement device shown in FIG. 1A.

Referring to FIG. 5 and as described above, additional sensors or equipment may be installed in a given line sensor assembly 10, e.g. a Rogowski coil 50 that may be used to measure current in a core or power line such as power line 32A shown in the figure. As depicted in FIG. 5, coil 50 is a wire winding. As such, the current i(t) flowing through power line 32A induces a voltage v(t) in coil 50 that is proportional to the current i(t). The voltage v(t) is fed to amplification package 51 for ultimate output as a voltage at 52. Accordingly, the output voltage 52 is also proportional to the current in power line 32A.

Referring again to FIGS. 1A and 3A, the operation of the configuration array 6 is further described. The array 6 may comprise a plurality of passive or active elements that are space around the entire circumference of the line sensor, e.g., as part of the electronics package 3. In one example, the passive elements may include corner reflectors to allow an installation technician to use a laser or other equipment to automatically compute the system geometries (e.g., for system 300 shown in FIG. 3A). The geometries can then be used to compute the [A], [B], and [C] matrices described above.

In another example, the line sensors themselves can compute the geometries by executing an auto-configuration process using array 6. In this example, the array 6 may contain an array of lasers or light emitting diodes (LEDs), sensing elements to sense laser or LED light, or a combination of light source and sensing elements. In one example, LEDs of array 6 may be turned on and off in sequence around a given line sensor, e.g., line sensor assembly 10A. At some point the other line sensor assemblies, 10B and 10C, will sense the LED light emitted by line sensor assembly 10A and report the detection. At this point, the relative angles between all three line sensor assemblies 10 are known.

In another example, the round trip detection times between the time the LED is turned on until the time it is detected or reported may be used to compute the distance between the line sensor assemblies 10 using known techniques. This information in combination with other sensor (e.g., GPS, gravity sensors, etc.) can allow either a given line sensor assembly 10 or local station 35 to determine the system geometries used to compute the [A], [B], and [C] matrices. The auto-configuration process may be performed periodically or in response to detecting error. Any changes in geometry over time may facilitate system maintenance or error troubleshooting.

In sum, an apparatus is provided for measuring electric fields comprising a plurality of electric field sensors configured to sense electric fields to determine line characteristics of one or more power lines. A support structure is configured to engage a first power line along a central axis of the apparatus, the plurality electric field sensors being secured to the support structure such that the electric field sensors are positioned annularly around and spaced apart from the central axis and spaced apart from each other to provide spatial diversity for sensing electric fields at the plurality electric field sensors. The support structure may comprise first and second end portions, each having a center aperture configured to engage the first power line and an outer rim configured to secure one end of each of the electric field sensors such that the electric field sensors extend longitudinally between the end portions in parallel with the central axis.

A measurement circuit is configured to measure an electric field across each of the plurality of electric field sensors to produce a first set of electric field measurements. An interface unit may be provided and configured to send and receive data including electric field measurements over one or more networks. The interface unit may be further configured to receive line configuration parameters, where the line configuration parameters comprise a geometric relationship of electric field sources and sinks relative to the first power line. Each electric field sensor may include first and second conductive surfaces and a dielectric material disposed there between. The plurality of electric field sensors may include a minimum of four electric field sensors.

The apparatus may further include a processor configured to compute line characteristics for the first power line based on the line configuration parameters and the first set of electric field measurements. The processor may be further configured to compute line characteristics of a multi-phase transmission system comprising a plurality of power lines including the first power line based on the line configuration parameters and the first set of electric field measurements.

The interface unit may be further configured to receive a second set of electric field measurements for a second power line among the plurality of power lines, and the processor is further configured to compute line characteristics for the plurality of power lines based on the line configuration parameters, the first set of electric field measurements and the second set of electric field measurements.

The apparatus may further comprise a current sensor configured to measure current in the power line as one of the line characteristics for the first power line, and one or more of: a gravity sensor configured to provide an orientation of the plurality of electric field sensors with respect to the surface of the Earth; a location sensor configured to generate geolocation data for the apparatus; and an environmental sensor configured to measure environmental parameters for the apparatus.

The apparatus may further comprise a configuration array configured to facilitate an automated determination of the line configuration parameters.

A system may be provided for measuring line characteristics of one or more power lines, the system comprising a plurality of line characteristic measurement sensor assemblies, each line characteristic measurement sensor assembly including a plurality of electric field measurement units configured to sense electric fields to determine line characteristics of one or more power lines; a support structure configured to engage a power line along a central axis of the line characteristic measurement sensor assembly, the plurality of electric field measurement units being secured to the support structure such that the electric field measurement units are positioned annularly around and spaced apart from the central axis and spaced apart from each other to provide spatial diversity for sensing electric fields at the plurality electric field measurement units; a measurement circuit configured to measure an electric field across each of the plurality of electric field measurement units to produce a set of electric field measurements; and an interface unit configured to interface send and receive data over one or more networks including electric field measurements.

The system may further include a processing module configured with line configuration parameters, where the line configuration parameters comprise a geometric relationship of electric field sources and sinks relative to a given power line; the processing module is configured to compute line characteristics for the given power line based on the line configuration parameters and one or more sets of electric field measurements. The processing module is configured to be hosted by one of the line characteristic measurement sensors and/or a based station, wherein the base station is local to or remote from the plurality of line characteristic measurement sensors.

The processing module may be configured to compute line characteristics for a power line in a single phase electric transmission system based on line configuration parameters for the transmission line in the single phase electric transmission system and a set of electric field measurements received from an electric field measurement sensor stationed with the power line, and/or compute line characteristics for a first power line in a multi-phase electric transmission system based on line configuration parameters for the first power line in the multi-phase electric transmission system and a set of electric field measurements received from an electric field measurement sensor stationed with the first power line.

The processing module may be configured to compute line characteristics for at least first and second power lines in a multi-phase electric transmission system based on line configuration parameters for the first power line, line configuration parameters for the second power line and sets of electric field measurements received from electric field measurement sensors stationed with the first and second power lines, respectively.

In another embodiment, a method for measuring line characteristics of one or more power lines is provided, the method comprising determining line configuration parameters for each of the one or more power lines, where the line configuration parameters comprise a geometry of electric field sources and sinks relative to a given power line. Sets of electric field measurements are obtained from each of one or more electric field measurement sensors each with a plurality of electric field measurement units, where each electric field measurement sensor is collocated with one of the one or more power lines and is configured to measure an electric field across each of the plurality of electric field measurement units to form a corresponding electric field measurement set for that electric field measurement sensor. Line characteristics for a given power line are computed based on the line configuration parameters for the given power line and one or more sets of electric field measurements.

The method may further comprise validating a set of electric field measurements and/or line characteristics for a given power line based on the corresponding line configuration parameters, where when the set of electric field measurements and/or line characteristics for a given power line is invalid, determining a source of error. An error report may be generated that includes the source of error.

Computing may include computing line characteristics for each power line in a multi-phase transmission system based on a combination of the line configuration parameters for each power line in the multi-phase transmission system and their corresponding sets of electric field measurements. The line characteristics may comprise line sag, voltage, current, and line to neutral voltage with corresponding amplitude, phase and angular frequency components. The method may be preformed periodically or on demand.

Having described example embodiments of a new and improved technique for measuring line characteristics of three-phase power transmission lines, it is believed that other modifications, variations and changes will be suggested to those skilled in the art in view of the teachings set forth herein. It is therefore to be understood that all such variations, modifications and changes are believed to fall within the scope of the present invention as defined by the appended claims. Although specific terms are employed herein, they are used in a generic and descriptive sense only and not for purposes of limitation.

What is claimed is:

1. A system for measuring line characteristics of one or more power lines, the system comprising:
   a plurality of line characteristic measurement sensor assemblies, each line characteristic measurement sensor assembly including:
      a plurality of electric field measurement units configured to sense electric fields to determine line characteristics of one or more power lines;
      a support structure configured to engage a power line along a central axis of the line characteristic measurement sensor assembly, the plurality of electric field measurement units being secured to the support structure such that the electric field measurement units are positioned around an annular region, the annular region arranged around and spaced apart from the central axis, and spaced apart from each other to provide spatial diversity for sensing free space electric fields at the plurality of electric field measurement units, including at least one electric field originating from an electric field source or sink arranged outside of the annular region;
      a measurement circuit configured to measure an electric field across each of the plurality of electric field measurement units to produce a set of electric field measurements; and
      an interface unit configured to interface send and receive data over one or more networks including electric field measurements, and
   a processing module hosted by one of the line characteristic measurement sensor assemblies or a base station, wherein the base station is local to or remote from the plurality of line characteristic measurement sensor assemblies and configured with line configuration parameters, wherein the line configuration parameters comprise a geometric relationship of electric field sources and sinks relative to a given power line, and configured to compute line characteristics for at least first and second power lines in a multi-phase electric transmission system based on line configuration parameters for the first power line, line configuration parameters for the second power line and sets of electric field measurements received from line characteristic measurement sensor assemblies stationed with the first and second power lines, respectively.

2. The system of claim 1, wherein the support structure comprises first and second end portions, each having a center aperture configured to engage the power line and an outer rim configured to secure one end of each of the electric field measurement units such that the electric field measurement units extend longitudinally between the end portions in parallel with the central axis.

3. The system of claim 1, wherein the processing module is configured to:
   compute line characteristics for a first power line in a multi-phase electric transmission system based on line configuration parameters for the first power line in the multi-phase electric transmission system and a set of electric field measurements received from an electric field measurement sensor assembly stationed with the first power line.

4. A method for measuring line characteristics of one or more power lines, the method comprising:
   determining line configuration parameters for each of the one or more power lines of a multi-phase electric transmission system, wherein the line configuration parameters comprise a geometry of electric field sources and sinks relative to a given power line;
   obtaining sets of electric field measurements from a plurality of electric field measurement sensors each with a plurality of electric field measurement units, wherein each electric field measurement sensor is collocated with one of the one or more power lines, wherein each electric field measurement sensor of the plurality of electric field measurement units are arranged around an annular region around the power line to which the electric field measurement sensor is collocated, and wherein obtaining a set of electric field measurements for each of the one or more electric field measurement sensors comprises measuring a free space electric field across each of the plurality of electric field measurement units to form a corresponding electric field measurement set for that electric field measurement sensor, wherein each of the one more electric field measurements includes measurement of at least one electric field originating from an electric field source or sink arranged outside of the respective annular region for each electric field measurement unit; and
   computing line characteristics for at least first and second power lines in the multi-phase electric transmission system based on line configuration parameters for the first power line, line configuration parameters for the second power line and sets of electric field measurements received from electric field measurement sensors of the plurality of electric field measurement sensors stationed with the first and second power lines, respectively.

5. The method of claim 4, further comprising:
   validating a set of electric field measurements or line characteristics for a given power line based on the corresponding line configuration parameters, wherein when the set of electric field measurements or line characteristics for a given power line is invalid;
   determining a source of error; and
   generating an error report including the source of error in the error report.

6. The method of claim 4, wherein computing comprises computing line characteristics for each power line in the multi-phase transmission system based on a combination of the line configuration parameters for each power line in the multi-phase transmission system and their corresponding sets of electric field measurements.

7. The method of claim 4, wherein the line characteristics comprise line sag, voltage, current, and line to neutral voltage with corresponding amplitude, phase and angular frequency components.

8. The method of claim 4, wherein the determining, obtaining and computing are preformed periodically or on demand.

9. A system comprising:
a plurality of line conductors;
a plurality of line characteristic measurement sensor assemblies, each line characteristic measurement sensor assembly configured to measure line characteristics for one of the plurality of line conductors and comprising:
   a plurality of electric field measurement units configured to sense electric fields to determine line characteristics of the one of the plurality of line conductors,
   a support structure configured to engage the one of the plurality of line conductors along a central axis of the line characteristic measurement sensor assembly, the plurality of electric field measurement units being secured to the support structure such that the electric field measurement units are positioned around an annular region, the annular region around and spaced apart from the central axis, and spaced apart from each other to provide spatial diversity for sensing free space electric fields at the plurality of electric field measurement units;
   a measurement circuit configured to measure an electric field across each of the plurality of electric field measurement units to produce a set of electric field measurements, wherein the electric field measurements include measurements of at least one electric field originating from an electric field source or sink arranged outside of the annular region; and
   an interface unit configured to interface send and receive data over one or more networks including electric field measurements, and
a processing module hosted by one of the line characteristic measurement sensor assemblies or a base station, configured with line configuration parameters for the plurality of line conductors, and configured to compute line characteristics for the plurality of line conductors from the line configuration parameters and sets of electric field measurements received from line characteristic measurement sensor assemblies.

10. The system of claim 9, wherein the at least one electric field originating from an electric field source or sink arranged outside of the annular region comprises a second one of the plurality of line conductors.

11. The system of claim 9, wherein the plurality of line conductors comprise power lines in a multi-phase transmission system.

12. The system of claim 9, wherein the line configuration parameters for the plurality of line conductors comprise a relative geometrical arrangement of the plurality of line conductors.

13. The system of claim 9, wherein the processing module is hosted by the station, and wherein the base station:
   is remote from the plurality of line characteristic measurement sensor assemblies, and
   receives sets of electric field measurements received from line characteristic measurement sensor assemblies over the one more networks from the interface units of the plurality of line characteristic measurement sensor assemblies.

14. The system of claim 9, wherein the plurality of line conductors consists of three line conductors.

15. The System of claim 9, wherein each electric field sensors includes first and second conductive surfaces and a dielectric material disposed there between.

16. The system of claim 9, wherein the support structure comprises first and second end portions, each having a center aperture configured to engage the one of the plurality of line conductors and an outer rim configured to secure one end of each of the electric field measurement units such that the electric field measurement units extend longitudinally between the end portions in parallel with the central axis.

17. The system of claim 9, wherein each of the plurality of line characteristic measurement sensor assemblies further comprising a current sensor configured to measure current in the one of the plurality of line conductors.

18. The system of claim 9, wherein the line characteristics comprise line sag, voltage, current, and line to neutral voltage with corresponding amplitude, phase and angular frequency components.

19. The system of claim 9, further comprising a configuration array configured to facilitate an automated determination of the line configuration parameters.

20. The system of claim 9, wherein each of the plurality of line characteristic measurement sensor assemblies include a minimum of four electric field measurement units.

* * * * *